United States Patent
Takiguchi et al.

(10) Patent No.: US 10,996,574 B2
(45) Date of Patent: May 4, 2021

(54) SUBSTRATE PROCESSING APPARATUS, ARTICLE MANUFACTURING METHOD, SUBSTRATE PROCESSING METHOD, SUBSTRATE PROCESSING SYSTEM, MANAGEMENT APPARATUS, AND STORAGE MEDIUM

(71) Applicant: CANON KABUSHIKI KAISHA, Tokyo (JP)

(72) Inventors: Takahiro Takiguchi, Utsunomiya (JP); Shinichiro Koga, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/830,753

(22) Filed: Mar. 26, 2020

(65) Prior Publication Data
US 2020/0333718 A1    Oct. 22, 2020

(30) Foreign Application Priority Data
Apr. 18, 2019    (JP) .............................. JP2019-079564

(51) Int. Cl.
*G03F 9/00* (2006.01)
(52) U.S. Cl.
CPC ................................. *G03F 9/7019* (2013.01)
(58) Field of Classification Search
CPC ..................................................... G03F 9/7019
See application file for complete search history.

(56) References Cited

U.S. PATENT DOCUMENTS

| 7,590,280 | B2 | 9/2009 | Tanaka | |
|---|---|---|---|---|
| 10,733,744 | B2* | 8/2020 | Ha | G06K 9/6267 |
| 2010/0007885 | A1* | 1/2010 | Li | G03F 7/70625 356/400 |
| 2017/0193400 | A1* | 7/2017 | Bhaskar | G06N 3/0472 |
| 2019/0361363 | A1* | 11/2019 | Brauer | G03F 9/7007 |

FOREIGN PATENT DOCUMENTS

JP    2000260699 A    9/2000

* cited by examiner

*Primary Examiner* — Steven Whitesell Gordon
(74) *Attorney, Agent, or Firm* — Rossi, Kimms & McDowell LLP

(57) ABSTRACT

A substrate processing apparatus is provided. The apparatus includes an imaging unit that images a mark on a substrate, and a processor that aligns the substrate based on an image of the mark obtained by the imaging unit. If the alignment has failed, the processor identifies a factor of the failure based on information including the image and executes at least one of a plurality of recovery processes based on the identified factor. The processor includes an output unit that outputs a condition for the at least one of recovery processes in accordance with an inference model, and a learning unit that learns the inference model based on an execution result of the at least one of the recovery processes under the condition output from the output unit.

14 Claims, 7 Drawing Sheets

FIG. 6

| No. | FACTOR | RECOVERY PROCESS |
|---|---|---|
| 6-1 | POSITIONAL DEVIATION IN SUBSTRATE TRANSFER | EXPANSION OF SEARCH RANGE FOR ALIGNMENT MARK |
| 6-2 | LOW CONTRAST | CHANGE OF MEASUREMENT CONDITION |
| 6-3 | COLLAPSE OF ALIGNMENT MARK | CHANGE OF ALIGNMENT MARK TO BE USED |
| : | : | : |

FIG. 7

| No. | RECOVERY PROCESS | CONDITIONS |
|---|---|---|
| 7-1 | EXPANSION OF SEARCH RANGE FOR ALIGNMENT MARK | • SEARCH RANGE (X, Y)<br>• SEARCH ORDER |
| 7-2 | CHANGE OF MEASUREMENT CONDITION | • NUMBER OF CHANGED ILLUMINATION MODES<br>• NUMBER OF CHANGED MARK CONTRAST SETTINGS<br>• NUMBER OF CHANGED LIGHT-CONTROL TOLERANCE SETTINGS<br>• NUMBER OF CHANGED ALIGNMENT OFFSETS |
| 7-3 | CHANGE OF ALIGNMENT MARK TO BE USED | • DETERMINATION METHOD OF ALTERNATIVE ALIGNMENT MARK<br>• COPING METHOD FOR FAILURE IN MEASUREMENT OF ALTERNATIVE ALIGNMENT MARK |
| : | : | : |

SUBSTRATE PROCESSING APPARATUS, ARTICLE MANUFACTURING METHOD, SUBSTRATE PROCESSING METHOD, SUBSTRATE PROCESSING SYSTEM, MANAGEMENT APPARATUS, AND STORAGE MEDIUM

BACKGROUND OF THE INVENTION

Field of the Invention

The present invention relates to a substrate processing apparatus, an article manufacturing method, a substrate processing method, a substrate processing system, a management apparatus, and a storage medium.

Description of the Related Art

A photolithography step uses a substrate processing apparatus such as an exposure apparatus or imprint apparatus. Such a substrate processing apparatus is required to improve the accuracy of relative alignment between an original and a substrate with the recent miniaturization trend of semiconductor elements. Various techniques have been proposed for the improvement of the accuracy of alignment (for example, Japanese Patent Laid-Open No. 2000-260699). In order to improve the accuracy of alignment, it is necessary to stably perform high-accuracy alignment measurement (the detection of marks on a substrate).

Even at present, alignment measurement often fails. Accordingly, it is necessary to prepare a recovery process for recovery from such failures.

Conventionally, when a mark cannot be properly detected, a plurality of recovery processes are executed, including the change of the mark, of a plurality of marks, which is used, the change of a detection range, the change of illumination conditions, and retry of image processing. This takes much time to complete all recovery processes, resulting in a considerable decrease in the productivity of substrate processes.

SUMMARY OF THE INVENTION

The present invention provides, for example, a substrate processing apparatus that provides an advantageous effect in terms of productivity by reducing the recovery process time at occurrence of a failure in a substrate process.

The present invention in its one aspect provides a substrate processing apparatus that processes a substrate, the apparatus comprising an imaging unit configured to image a mark provided on the substrate, and a processor configured to align the substrate based on a position of the mark obtained by processing an image of the mark obtained by the imaging unit, wherein if the alignment has failed, the processor identifies a factor of the failure based on information including the image and executes at least one of a plurality of recovery processes based on the identified factor of the failure, and the processor includes an output unit configured to output a condition for the at least one of the recovery processes corresponding to the identified factor of the failure, in accordance with an inference model, and a learning unit configured to learn the inference model based on an execution result obtained from the at least one of the recovery processes under the condition output from the output unit.

Further features of the present invention will become apparent from the following description of exemplary embodiments (with reference to the attached drawings).

BRIEF DESCRIPTION OF THE DRAWINGS

FIG. 6 is a view showing an example of a table describing the correspondence relationship between the factors of failures in alignment processes and recovery processes to be executed;

FIG. 7 is a view showing an example of the correspondence relationship between the respective recovery processes and recovery process conditions.

DESCRIPTION OF THE EMBODIMENTS

Figure 1:
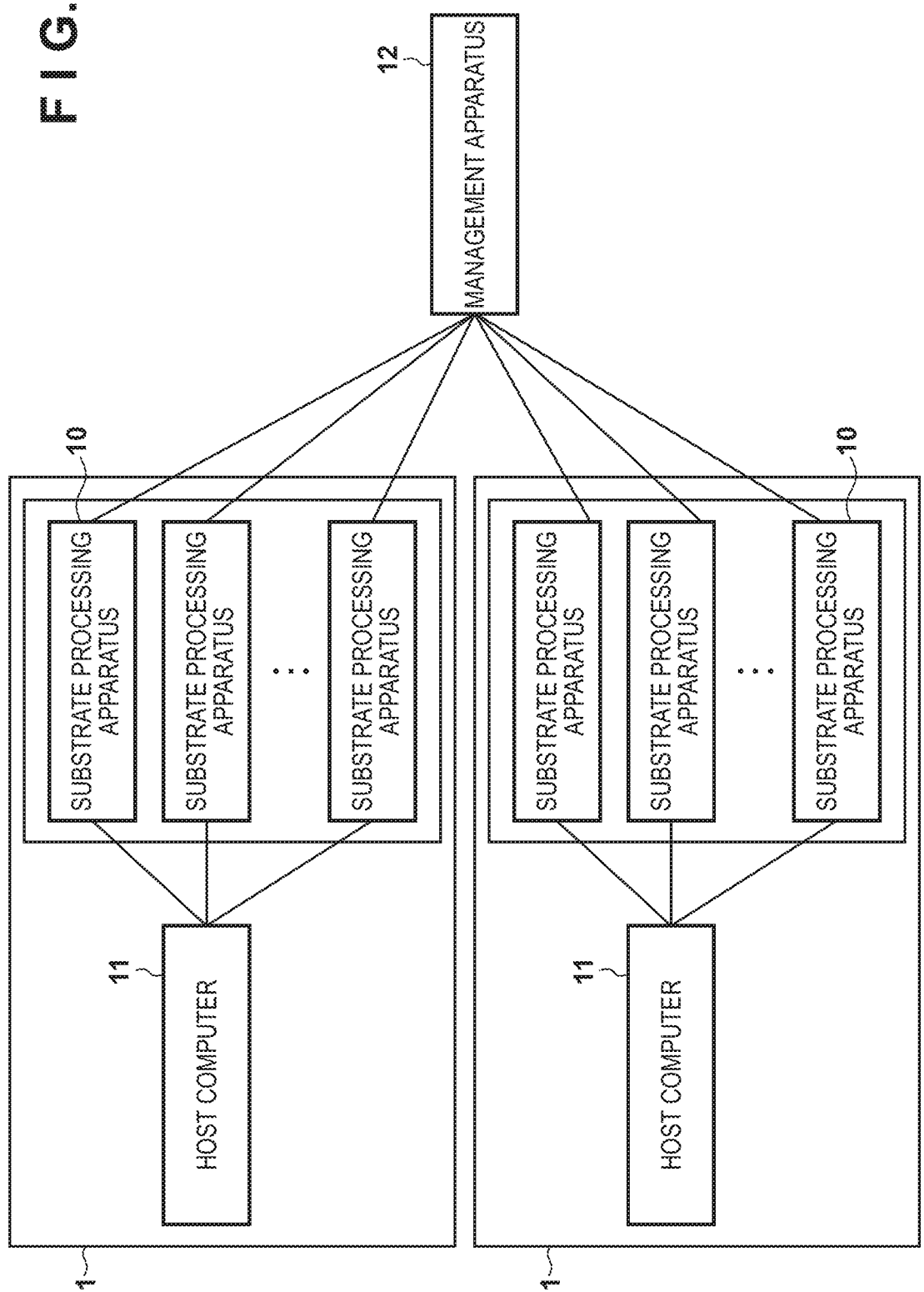
FIG. 1 is a block diagram showing the arrangement of a substrate processing system according to an embodiment.

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate. Furthermore, in the attached drawings, the same reference numerals are given to the same or similar configurations, and redundant description thereof is omitted.

FIG. 1 is a block diagram showing the arrangement of a substrate processing system according to an embodiment. A semiconductor manufacturing line 1 can include a plurality of substrate processing apparatuses 10 (semiconductor manufacturing apparatuses) each of which processes a substrate and a host computer 11 (host control device) that controls the operations of the plurality of substrate processing apparatuses 10. For example, each of the plurality of substrate processing apparatuses 10 can be any of the following apparatuses: a lithography apparatus (an exposure apparatus, imprint apparatus, charged-particle beam drawing apparatus, or the like), a deposition apparatus (a CVD apparatus or the like), a machining apparatus (a laser machining apparatus or the like), and an inspection apparatus (an overlay inspection apparatus or the like). The plurality of substrate processing apparatuses can include a coating/developing apparatus (coater/developer) that performs a process of coating a substrate with a resist material (adherence agent) as a preprocess for a lithography process and also performs a developing process as a postprocess for the lithography process. Note that the exposure apparatus exposes the photoresist supplied onto a substrate to light via an original (mask) to form a latent image corresponding to the pattern of the original on the photoresist. The imprint apparatus forms a pattern on a substrate by curing the imprint material supplied onto the substrate while a mold (original) is in contact with the imprint material. The charged-particle beam drawing apparatus forms a latent image on the photoresist supplied onto a substrate by drawing a pattern on the photoresist with a charged-particle beam.

Each of the plurality of substrate processing apparatuses 10 on the semiconductor manufacturing line 1 is connected to a management apparatus 12 that performs maintenance management. Note that, as shown in FIG. 1, the substrate processing system can include a plurality of semiconductor manufacturing lines 1. Accordingly, the management apparatus 12 can manage each substrate processing apparatus on a plurality of semiconductor manufacturing lines. The management apparatus 12 can function as a maintenance determination apparatus that collects and analyzes operation information concerning each of the plurality of substrate processing apparatuses 10, detects abnormality or its sign in each substrate processing apparatus, and determines the necessity/unnecessity of a maintenance process. Referring to FIG. 1, connection between the plurality of substrate processing apparatuses and the host computer 11 and connection between the plurality of substrate processing apparatuses and the management apparatus 12 each are limited to neither wired connection nor wireless connection.

Figure 2:
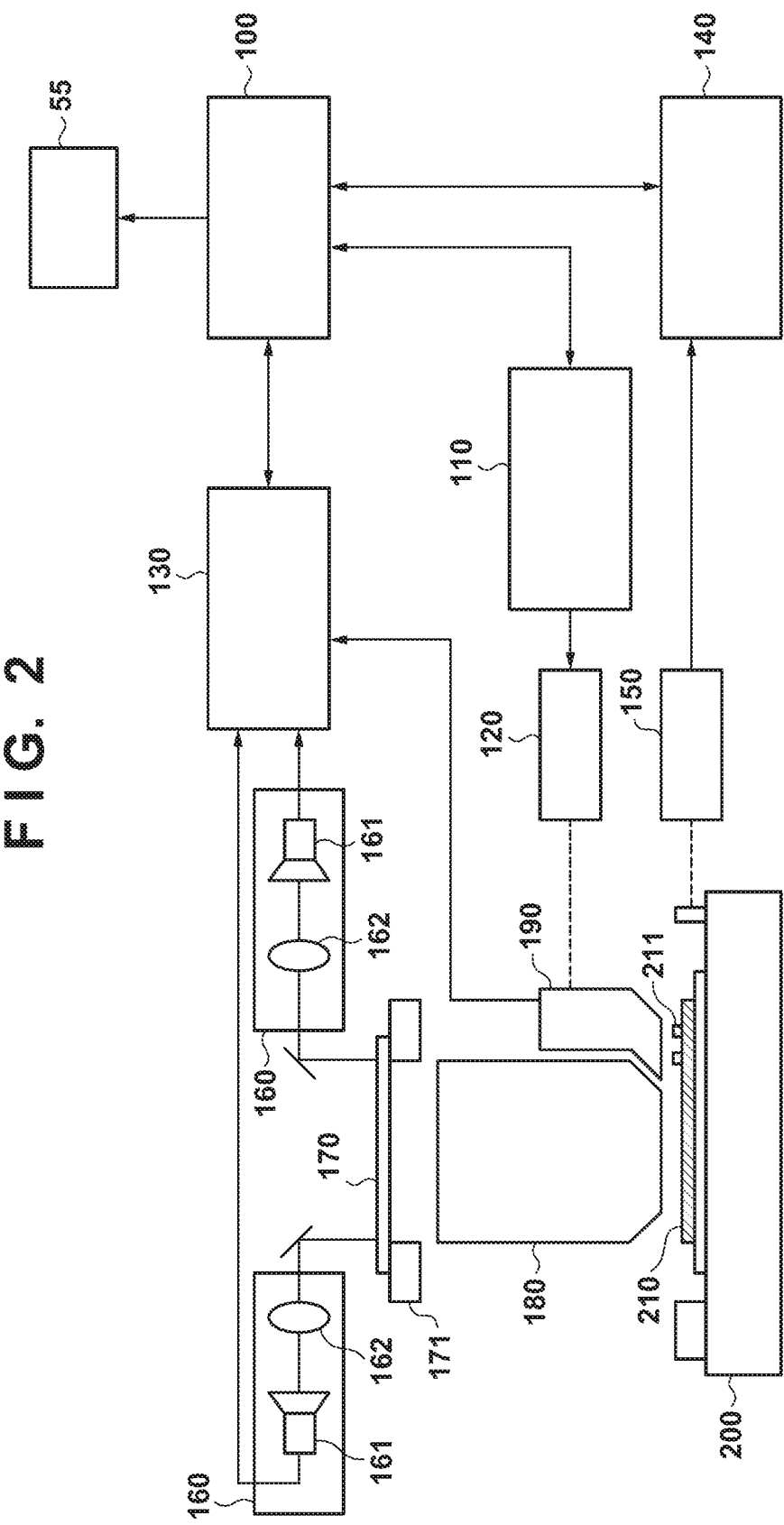
FIG. 2 is a schematic view showing the arrangement of an exposure apparatus according to the embodiment.

To present a specific example, the following will exemplify a case in which each of the plurality of substrate processing apparatuses 10 is configured as an exposure apparatus. FIG. 2 is a schematic view showing the arrangement of the exposure apparatus 10 according to one aspect of the present invention. The exposure apparatus 10 is a lithography apparatus that is used to manufacture a device such as a semiconductor element, liquid crystal display element, or thin-film magnetic head as an article, and performs patterning on a substrate. The exposure apparatus 10 exposes the substrate by a step-and-scan method or step-and-repeat method.

The exposure apparatus 10 includes a main controller 100, alight source controller 110, an alignment light source 120, an image processor 130, a stage controller 140, and an interferometer 150. The exposure apparatus 10 also includes reticle alignment optical systems 160, a reticle stage 171, a projection optical system 180, a substrate alignment optical system 190, a substrate stage 200, and a transmission unit 55.

The reticle stage 171 moves while holding a reticle 170 to be illuminated by an illumination optical system (not shown). A pattern to be transferred to a substrate 210 is drawn in the reticle 170. The projection optical system 180 projects the pattern of the reticle 170 on the substrate 210. The substrate stage 200 serves as a holding unit which is movable while holding a substrate. In this embodiment, the substrate stage 200 moves while holding the substrate 210.

The reticle alignment optical systems 160 are used to align the reticle 170. Each reticle alignment optical system 160 includes, for example, an imaging device 161 formed by charge-accumulation type photoelectric conversion elements, and an optical system 162 for guiding light from an alignment mark (to be simply referred to as a "mark" hereinafter) provided on the reticle 170 to the imaging device 161. The substrate alignment optical system 190 is used to align the substrate 210. The substrate alignment optical system 190 functions as an imaging unit that images a mark 211 provided on the substrate 210. In this embodiment, the substrate alignment optical system 190 is configured as an off-axis optical system.

The main controller 100 includes a CPU and memory, and controls the overall operation of the exposure apparatus 10. The main controller 100 controls the respective units of the exposure apparatus 10, and performs exposure processing of exposing the substrate 210 and its associated processing. In this embodiment, the main controller 100 controls the substrate stage 200 based on the position of the mark formed on the reticle 170 and the mark 211 formed on the substrate 210. In other words, the main controller 100 performs alignment of the reticle 170 and the substrate 210, for example, global alignment.

The alignment light source 120 includes a halogen lamp, and illuminates the mark 211 formed on the substrate 210. The light source controller 110 controls the illumination intensity of light from the alignment light source 120, that is, light used to illuminate the mark 211.

The image processor 130 obtains the position of the mark by performing image processing for image signals (detection signals) from the imaging devices 161 of the reticle alignment optical systems 160 and the imaging device of the substrate alignment optical system 190. The main controller 100 controls the alignment of the substrate 210 based on the obtained position of the mark. Note that the main controller 100 may include the function of the image processor 130. As described above, in this embodiment, the image processor 130 and the main controller 100 function as a processor that obtains the position of a mark by processing an image (alignment image) of the mark obtained by imaging and aligns a substrate based on the obtained position of the mark.

The interferometer 150 emits light to a mirror provided on the substrate stage 200, and detects light reflected by the mirror, thereby measuring the position of the substrate stage 200. The stage controller 140 moves (controls driving) the substrate stage 200 to an arbitrary position based on the position of the substrate stage 200 measured by the interferometer 150.

In the exposure apparatus 10, light (exposure light) from the illumination optical system passes through the reticle 170 held by the reticle stage 171, and enters the projection optical system 180. Since the reticle 170 and the substrate 210 have an optically conjugated positional relationship, the pattern of the reticle 170 is transferred, via the projection optical system 180, to the substrate 210 held by the substrate stage 200.

Figure 8:
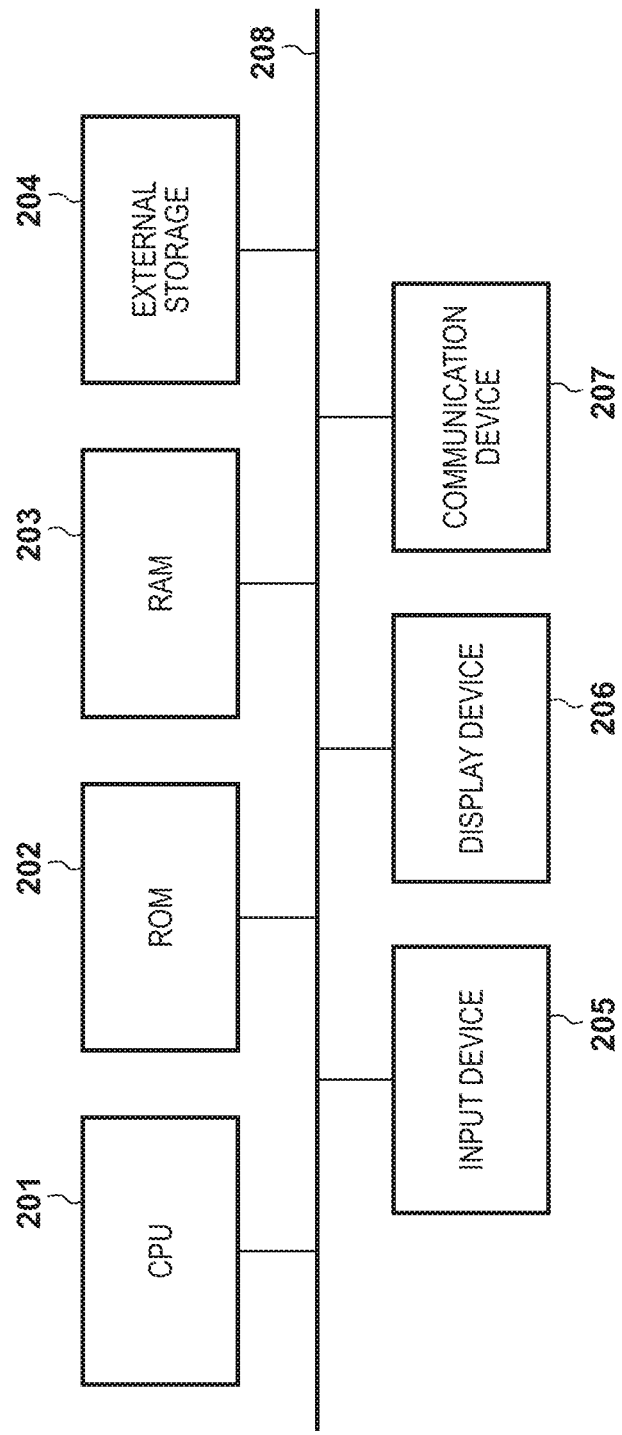
FIG. 8 is a block diagram showing the arrangement of a management apparatus according to the embodiment.

FIG. 8 is a block diagram showing the arrangement of the management apparatus 12. The management apparatus 12 can be implemented by a computer apparatus communicably connected to each exposure apparatus. Referring to FIG. 8, a CPU 201 executes an OS (Operating System) and various application programs. A ROM 202 stores fixed data among programs executed by the CPU 201 and parameters for computation. A RAM 203 provides a work area for the CPU 201 and a temporary storage area for data. The ROM 202 and the RAM 203 are connected to the CPU 201 via a bus 208. An input device 205 includes a mouse and a keyboard. A display device 206 is a CTR, liquid crystal display device, or the like. An external storage 204 is a hard disk drive, CD, DVD, memory card, or the like, and stores various programs including control programs for an exposure process and history data (log) concerning exposure processes. The input device 205, the display device 206, and the external storage 204 each are connected to the bus 208 via an interface (not shown). A communication device 207 that is connected to a network to perform communication is also connected to the bus 208. The communication device 207 is connected to, for example, a LAN to perform data communication according to a communication protocol such as TCP/IP, and is used to communicate with other communication devices. The communication device 207 functions as a transmission unit and reception unit for data. For example, the communication device 207 receives operation information from the transmission unit 55 in the exposure apparatus and records the information on the log stored in the external storage 204.

The schematic arrangement of the management apparatus 12 has been described above with reference to FIG. 8. The main controller 100 and the host computer 11 in the exposure apparatus each can have an arrangement similar to the above arrangement.

Figure 3:
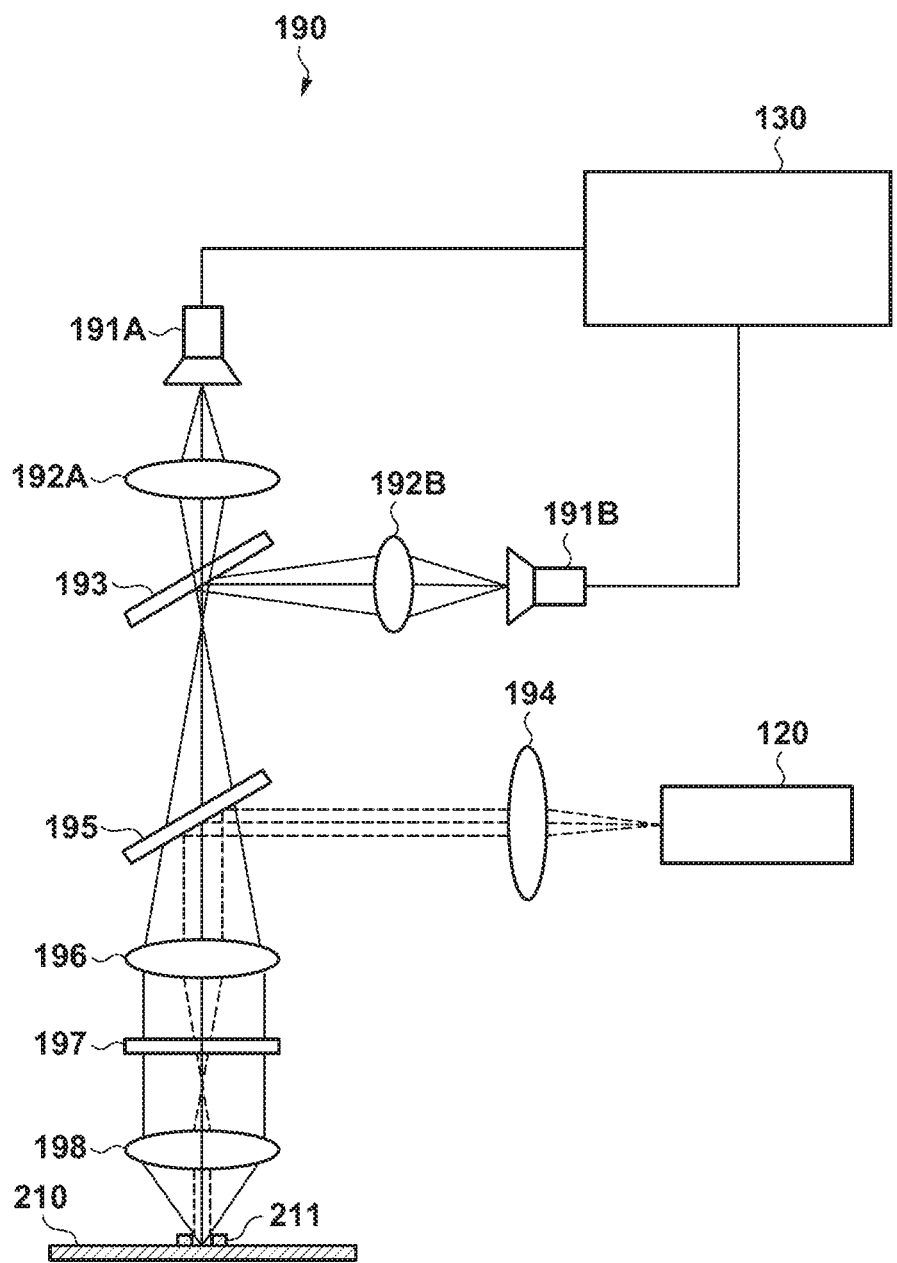
FIG. 3 is a schematic view showing the arrangement of a substrate alignment optical system according to the embodiment.

FIG. 3 is a schematic view showing the arrangement of the substrate alignment optical system 190. The substrate alignment optical system 190 detects (images) the mark 211 formed on the substrate 210 to generate an image signal. The substrate alignment optical system 190 includes imaging devices 191A and 191B, imaging optical systems 192A and 192B, a half mirror 193, an illumination optical system 194, a polarizing beam splitter 195, a relay lens 196, a λ/4 plate 197, and an objective lens 198.

Light from the alignment light source 120 is guided to the substrate alignment optical system 190 via an optical fiber (not shown) or the like. The light guided to the substrate alignment optical system 190 enters the polarizing beam splitter 195 via the illumination optical system 194. Light reflected by the polarizing beam splitter 195 passes through the relay lens 196, λ/4 plate 197, and objective lens 198, and the mark 211 formed on the substrate 210 is illuminated with the light.

Light reflected by the mark 211 passes through the objective lens 198, λ/4 plate 197, relay lens 196, and polarizing beam splitter 195, and enters the half mirror 193. Each of light beams divided by the half mirror 193 at an appropriate ratio is guided to one of the imaging optical systems 192A and 192B having different imaging magnifications.

The imaging optical systems 192A and 192B form images of the mark 211 on the imaging planes of the imaging devices 191A and 191B, respectively. Each of the imaging devices 191A and 191B includes the imaging plane on which a region including the mark 211 is captured, and generates an image signal corresponding to the region captured on the imaging plane. The image signals generated by the imaging devices 191A and 191B are transferred to the image processor 130. In this embodiment, the image processor 130 performs pattern matching processing as image processing for the image signals, thereby obtaining the position of the mark 211 on each of the imaging planes of the imaging devices 191A and 191B. Note that image processing is not limited to pattern matching processing, and any processing capable of obtaining the position of the mark 211 may be performed. Therefore, image processing may be, for example, edge detection processing.

In the exposure apparatus 10, the two kinds of alignment, that is, pre-alignment and fine alignment are performed using the mark 211. In pre-alignment, the positional deviation amount of the substrate 210 fed from a substrate conveyance system to the substrate stage 200 is detected, and the substrate 210 is roughly aligned (positioned) so as to start fine alignment. In fine alignment, the position of the substrate 210 held by the substrate stage 200 is accurately measured, and the substrate 210 is finely aligned (positioned) so that the alignment error of the substrate 210 falls within an allowance.

The measurement of the mark 211 sometimes fails because of some factors. For example, the measurement of the mark 211 can fail when the mark 211 is blurred by the influence of a processing step for the substrate 210. In another case, the mark 211 can look blurred because of the influence of the aberration of the substrate alignment optical system 190. In still another case, the position of the mark 211 can be deviated from the fields of view of the imaging planes of the imaging devices 191A and 191B. Factors that cause deviations from the fields of view of the imaging planes can include factors in the apparatus, such as false measurement in pre-alignment and positional deviations in a conveying process before measurement. In addition, factors that cause deviations from the fields of view of the imaging planes can include factors in a processing step for the substrate 210, such as variation in the transfer position of the mark 211.

A failure in the measurement of the mark 211 will lead to a failure in alignment. When alignment fails, a predetermined recovery process is executed. Recovery processes can include, for example, the change of the mark, of a plurality of marks, which is used, the expansion of a detection range for images of marks, and the change of imaging conditions. Conventionally, a plurality of recovery processes are all executed to cope with all factors. However, it takes much process time when the plurality of recovery processes are all executed, resulting in a decrease in productivity.

Figure 4:
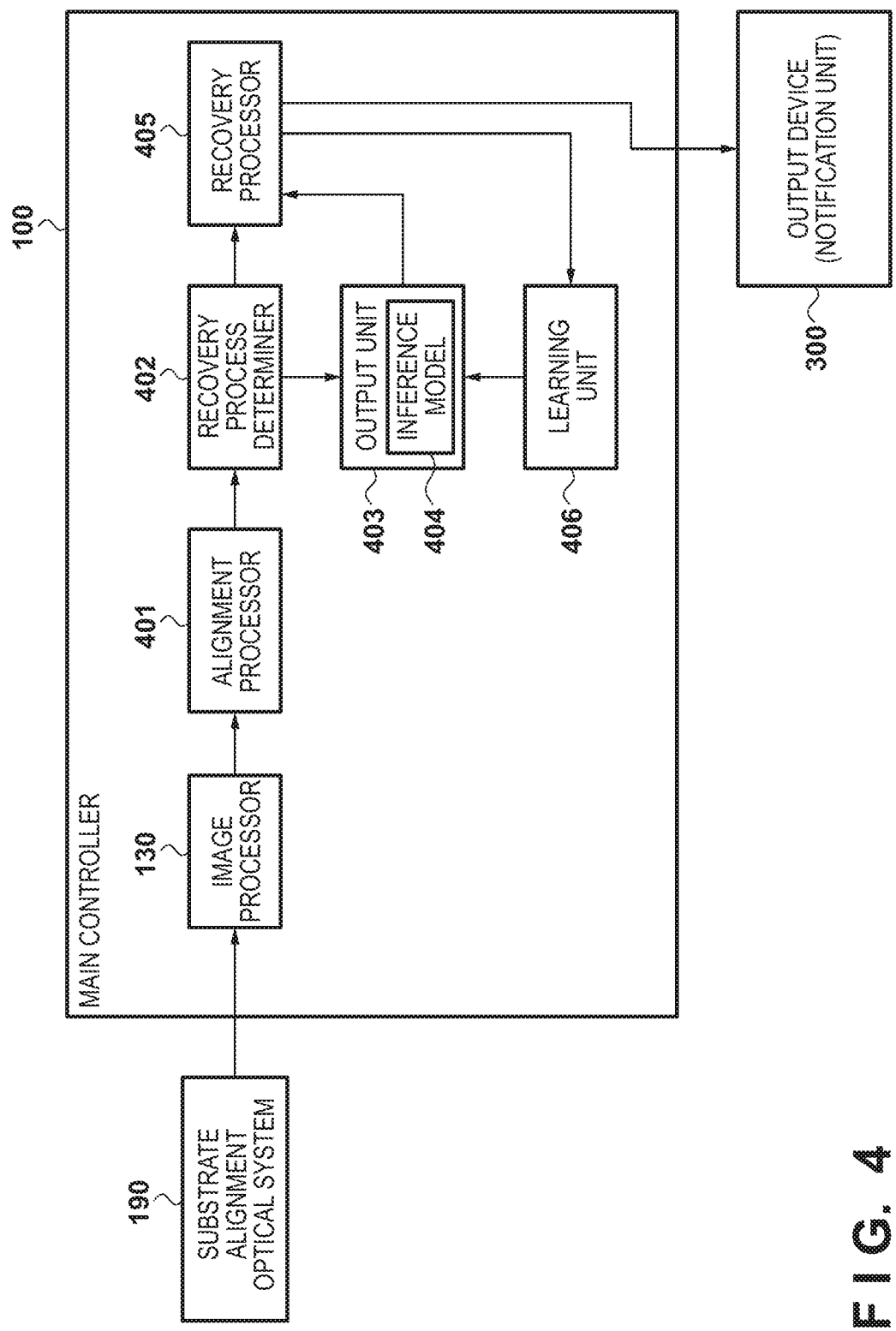
FIG. 4 is a block diagram showing the functional arrangement of a main controller (processor) associated with a recovery process according to the embodiment.

FIG. 4 is a block diagram showing the functional arrangement of the main controller 100 (processor) associated with a recovery process according to the embodiment. In this case, the image processor 130 is configured to be included in the main controller 100. As described above, the image processor 130 obtains the position of a mark by processing an image of the mark from the substrate alignment optical system 190 as an imaging unit. An alignment processor 401 controls the substrate stage 200 via the stage controller 140 to execute alignment (an alignment process) of a substrate based on the obtained position of the mark.

A recovery process determiner 402 determines whether alignment is successful. Upon determining that the alignment is unsuccessful, the recovery process determiner 402 identifies the factor of the failure based on alignment data including the image of the mark, and determines at least one of a plurality of recovery processes which should be executed. The alignment data can include various offset settings of the substrate processing apparatus 10 at the time of alignment measurement, the type of the mark 211, and context information in addition to the image of the mark (alignment image). In this case, the context information is information that can identify the model of the apparatus, serial number, hardware % software arrangement, installation line, lot, substrate, reticle, recipe, environmental conditions, process date and time, and the like. The context information can also include information concerning operation states at the time of alignment, such as an immediately preceding alignment result and the pressure with which the substrate stage 200 chucks the substrate 210.

A method of identifying the factor of a failure in the recovery process determiner 402 will be described. When there is a mark in the center of an alignment image included in alignment data, an alignment process will succeed with high probability. In contrast to this, when there is only part of a mark in an alignment image, an alignment process will fail with high probability. A factor of the failure at this time is assumed to be a positional deviation in a substrate transfer process, and is assigned with the classification label "positional deviation in substrate transfer".

Even when there is a mark in the center of an alignment image, an alignment process sometimes fails if the density difference of the overall image is small. The factor of this failure is assumed to be the low contrast of the overall image, and is assigned with classification label "low contrast".

It is possible to assign a more detailed classification label by using information concerning various offset settings of the substrate processing apparatus 10 at the time of alignment measurement, operation conditions at the time of alignment, and process results in addition to an alignment image. Assume that there is only part of a mark in an alignment image, an offset value in an alignment process is large, and a correction value in target substrate transfer is small. In this case, the factor of the failure can be assumed to be that the set offset is wrong. In this case, the factor is assigned with the label "offset error".

In contrast, assume that the offset value at the time of alignment is small, and the correction value in target substrate transfer is large. In this case, the factor of the failure can be assumed to be a positional deviation in substrate transfer. In this case, the factor is assigned with the classification label "positional deviation in substrate transfer".

An output unit 403 includes an inference model 404 that regards the factor of a failure as a state and determines conditions for a recovery process as actions corresponding to the state. The output unit 403 outputs the conditions for the recovery process determined by the recovery process determiner 402 in accordance with the inference model 404. A recovery processor 405 executes the at least one of the recovery processes determined by the recovery process determiner 402 under the conditions output from the output unit 403. A learning unit 406 learns the inference model 404 based on the result obtained by executing the at least one of the recovery processes under the conditions output from the output unit 403.

Figure 5:
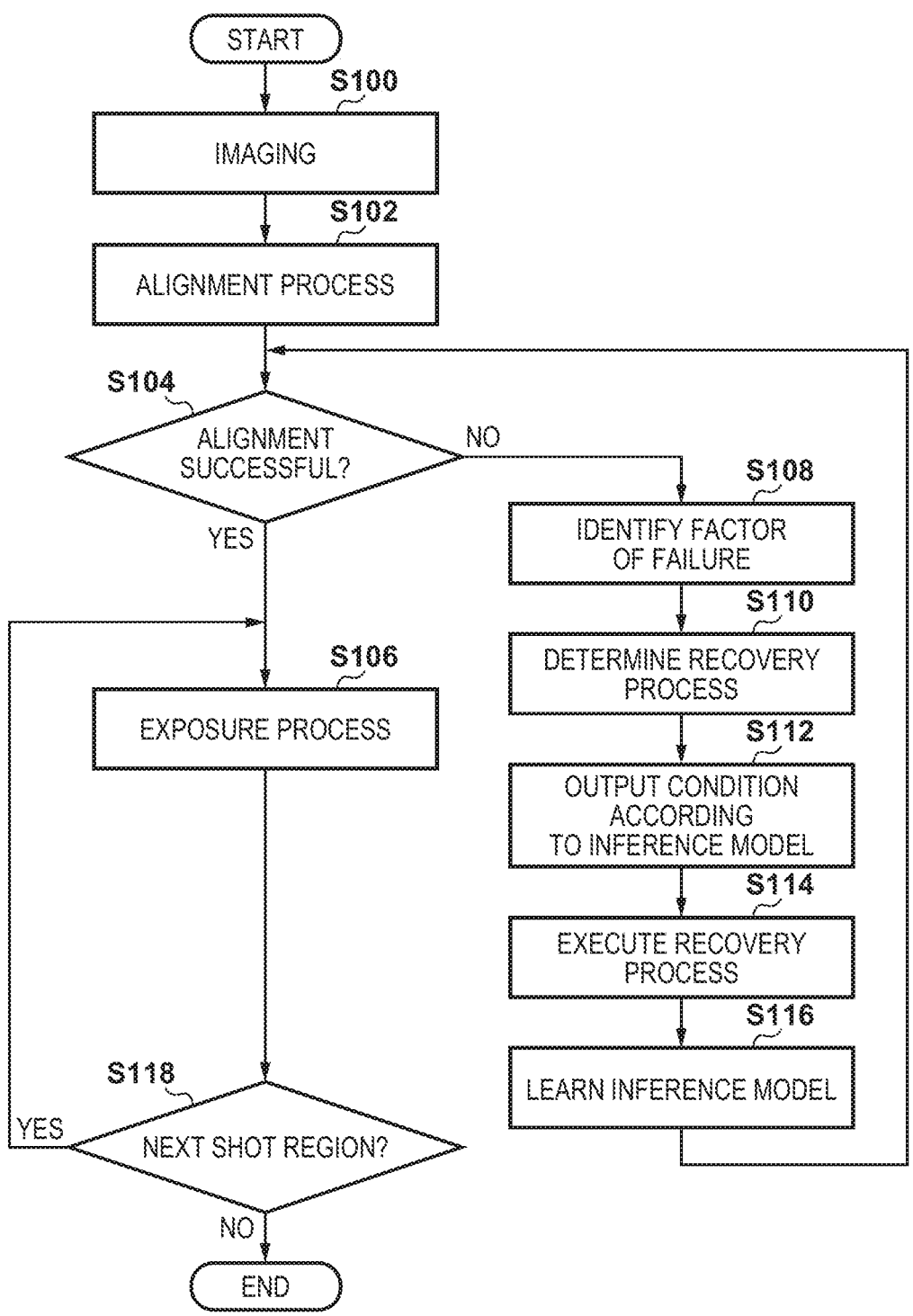
FIG. 5 is a flowchart showing a substrate processing method including a recovery process according to the embodiment.

FIG. 5 is a flowchart showing a substrate processing method including a recovery process according to the embodiment. The main controller 100 executes this substrate processing method. For example, a program corresponding to this flowchart is stored in the memory of the main controller 100, and the CPU executes the program.

In step S100, the substrate alignment optical system 190 as an imaging unit images a mark in a shot region on a substrate. The image of the mark obtained by imaging is transferred to the image processor 130. In step S102, the image processor 130 obtains the position of the mark by processing the received image of the mark. The alignment processor 401 controls the substrate stage 200 via the stage controller 140 to execute alignment (an alignment process) of the substrate based on the obtained position of the mark.

In step S104, the recovery process determiner 402 determines whether the alignment is successful. If, for example, an index corresponding to the image of the mark is smaller than a predetermined threshold, the recovery process determiner 402 determines that the alignment is unsuccessful. The index can include, for example, at least one of the signal intensity of the image of the mark, the contrast, and the degree of correlation derived from pattern matching.

If the alignment is successful, the main controller 100 executes an exposure process for a shot region in step S106. In step S118, the main controller 100 determines whether there is a next shot region to be processed. If there is a next region, the process returns to step S106 to repeat an exposure process for the next shot region. If exposure processes for all the shot regions are complete, this processing is terminated.

If the main controller 100 determines in step S104 that the alignment is unsuccessful, the recovery process determiner 402 identifies the factor of the failure based on alignment data including the image of the mark in step S108. In step S110, the recovery process determiner 402 determines at least one of a plurality of recovery processes which correspond to the identified factor of the failure. FIG. 6 shows the correspondence relationship between the factors of failures in alignment processes and recovery processes to be executed for each classification label. The main controller 100 stores a correspondence relationship like that shown in FIG. 6 as a table, and can determine a recovery process to be executed by referring to the table. The example shown in FIG. 6 is an example of presenting one recovery process upon identifying one factor with respect to one classification label. However, there may be a classification presenting a plurality of factors or a plurality of recovery processes.

In step S112, the output unit 403 outputs the conditions for the recovery process determined by the recovery process determiner 402 in accordance with the inference model 404. FIG. 7 shows an example of a correspondence relationship between the respective recovery processes shown in FIG. 6 and the conditions for the recovery processes. In this embodiment, the correspondence relationship shown in FIG. 7 is implemented by the inference model 404.

In step S114, the recovery processor 405 executes the at least one of the recovery processes determined by the recovery process determiner 402 under the conditions output from the output unit 403. At this time, an output device 300 (see FIG. 4) as a notification unit may notify the contents of the recovery processes executed. The output device 300 is, for example, a display device, which allows the user to know the contents of the executed recovery processes. Note that the output device 300 may be a display device (not shown) of the host computer 11 or the display device 206 of the management apparatus 12.

In step S116, the learning unit 406 learns the inference model 404 based on the results obtained by executing the at least one of the recovery processes under the conditions output from the output unit 403. The process then returns to step S104 to determine whether the alignment is successful. Note that if an alignment failure repeats more than a predetermined number of times in the same shot region in step S104, the main controller 100 may interrupt the processing. In addition, the alignment process in step S102 can be performed for shot regions on a plurality of predetermined inspected objects (global alignment).

Note that in the process example shown in FIG. 5, the learning of the inference model in step S116 is performed in a so-called online mode during an exposure process for each shot region. However, the learning of the inference model may be performed offline as a calibration process before an exposure process.

The following will exemplify the procedure of a recovery process in a case in which the recovery process determiner 402 in FIG. 4 determines that the factor (state) of an observed alignment failure is "positional deviation in substrate transfer". First of all, the recovery process determiner 402 determines "expansion of search range for alignment mark" as a recovery process corresponding to the state "positional deviation in substrate transfer" by, for example, referring to a table like that shown in FIG. 6. Subsequently, the output unit 403 selects and outputs "search range" and "search order" as actions which are conditions for "expansion of alignment mark search range" in accordance with the inference model 404 (see FIG. 7). At this time, deviation amounts X and Y in substrate transfer are estimated from immediately preceding alignment results to limit "search range" in the X direction and the Y direction. In addition, "search order" is determined to make a search in increasing order of distance from limited "search range". Setting a selected recovery process and conditions for the recovery process in the exposure apparatus 10 in advance in this manner will execute a recovery process suitable for an observed state instead of executing all recovery processes under all conditions. This makes it possible to reduce the recovery process time at occurrence of a failure in a substrate process and suppress a decrease in productivity due to the recovery process.

The learning of the inference model 404 by the learning unit 406 will be described in detail below. The following will exemplify the procedure of a recovery process in a case in which the recovery process determiner 402 determines the factor (state) of an observed alignment failure as "low contrast". First of all, the recovery process determiner 402 determines "change of measurement condition" as a recovery process corresponding to the state "low contrast" by, for example, referring to a table like that shown in FIG. 6. Subsequently, the output unit 403 selects and outputs "change of measurement condition" as an action in accordance with the inference model 404. In the example shown in FIG. 7, conditions selected at this time can be "number of changed illumination modes", "number of changed mark contrast settings", "number of changed light-control tolerance settings", and "number of changed alignment offsets". Assume that in this case, as specific examples, the output unit 403 determines and outputs "2" as "number of changed illumination modes" and "5" as "number of changed mark contrast settings" in accordance with the learnt inference model 404. With this operation, the recovery processor 405 sets "number of changed illumination modes" to "2" and "number of changed mark contrast settings" to "5", and executes the recovery process "change of measurement condition".

The learning unit 406 obtains the execution result of a recovery process executed in this manner and leans the inference model 404. The learning unit 406 can use, for example, reinforcement learning for this learning. Performing reinforcement learning will learn and construct an inference model that selects a suitable action by observing a state transition when a given action is selected in a given state and giving a reward according to the result obtained after the state transition. In the embodiment, reinforcement learning is performed by setting the factor of an alignment failure as a state and a condition for a recovery process corresponding to the state as an action and evaluating the reward obtained by the action. When MDP (Markov Decision Process) is used, reinforcement learning is performed by using an evaluation formula of a sum $V_t$ of rewards $r_t$ at the time of execution of an action at selected in a state $s_t$ observed at time t. For example, an evaluation formula of the sum $V_t$ is represented by $$V_t = \Sigma \gamma^k r_{t+1+k} (0 \leq \gamma < 1, k:0 \sim \infty)$$

where γ is a discount ratio for evaluating rewards such that rewards obtained in farther features are discounted more. Reinforcement learning is performed so as to maximize the expected value of the sum of rewards represented by such an evaluation formula.

For example, the recovery processor 405 executes the recovery process "change of measurement condition" upon setting "number of changed illumination modes" to "2", "number of changed mark contrast settings" to "5", and others to "0" as conditions (actions) for a recovery process. The learning unit 406 obtains the execution result of the recovery process. If the execution result indicates a success, a positive reward (for example, 1) is given. If the execution result indicates a failure, a negative reward (for example, −1) is given. This operation is performed for many states and actions to reinforce the inference model so as to maximize the cumulative value of rewards. Using the inference model 404 learnt in this manner allows the output unit 403 to select a recovery process that leads to a success with high probability and conditions for the recovery process in accordance with the factor of an alignment failure.

(Modification)

The function of the processor implemented by the main controller 100 of the exposure apparatus described above may be implemented by the management apparatus 12. In this case, the main controller 100 of the exposure apparatus transmits an image of a mark from the substrate alignment optical system 190 as an imaging unit to the management apparatus 12 via the transmission unit 55. The management apparatus 12 receives the image of the mark from the substrate alignment optical system 190 via the communication device 207 as a reception unit. Subsequently, the management apparatus 12 performs a process similar to that performed by the processor implemented by the main controller 100 of the exposure apparatus described above. That is, the management apparatus 12 has a functional arrangement associated with the recovery process shown in FIG. 4. The management apparatus 12 (CPU 201) instructs the exposure apparatus to align a substrate based on the position of a mark obtained by processing the received image. More specifically, if, for example, alignment has failed, the management apparatus 12 identifies the factor of the failure based on an image of a mark, and instructs the exposure apparatus to execute at least one of a plurality of recovery processes based on the identified factor of the failure. The management apparatus 12 then learns an inference model based on the execution result of the recovery process.

Embodiment of Method of Manufacturing Article

A method of manufacturing an article according to the embodiment of the present invention is suitable for manufacturing an article such as a microdevice such as a semiconductor device or an element having a microstructure. The method of manufacturing an article according to the embodiment can include a step of forming a pattern of an original on a substrate by using the above-described substrate processing system, a drawing apparatus, or the like), and a step of processing the substrate on which the pattern has been formed in the preceding step. Furthermore, this article manufacturing method can include other well-known steps (oxidization, deposition, vapor deposition, doping, planarization, etching, resist removal, dicing, bonding, packaging, and the like). The method of manufacturing an article according to the embodiment is superior to a conventional method in at least one of the performance, quality, productivity, and production cost of an article.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-079564, filed Apr. 18, 2019, which is hereby incorporated by reference herein in its entirety.

What is claimed is:

1. A substrate processing apparatus that processes a substrate, the apparatus comprising:
   an imaging unit configured to image a mark provided on the substrate; and
   a processor configured to align the substrate based on a position of the mark obtained by processing an image of the mark obtained by the imaging unit,
   wherein if the alignment has failed, the processor identifies a factor of the failure based on information including the image and executes at least one of a plurality of recovery processes based on the identified factor of the failure, and
   the processor includes an output unit configured to output a condition for the at least one of the recovery processes corresponding to the identified factor of the failure, in accordance with an inference model, and
   a learning unit configured to learn the inference model based on an execution result obtained from the at least one of the recovery processes under the condition output from the output unit.

2. The apparatus according to claim 1, wherein the learning is performed by setting a factor of the alignment failure as a state and a condition for a recovery process corresponding to the state as an action and evaluating a reward obtained by the action.

3. The apparatus according to claim 2, wherein the learning is performed so as to maximize an expected value of a sum of rewards obtained by actions selected in observed states.

4. The apparatus according to claim 3, wherein the learning includes giving a positive reward if a recovery process has succeeded under a condition determined as the selected action and giving a negative reward if the recovery process has failed.

5. The apparatus according to claim 1, wherein the processor determines that the alignment has failed, if an index corresponding to the image is lower than a predetermined threshold.

6. The apparatus according to claim 5, wherein the index includes at least one of a signal intensity of the image, a contrast, and a degree of correlation of pattern matching.

7. The apparatus according to claim 1, further comprising a notification unit configured to notify contents of the executed at least one of the recovery processes.

8. The apparatus according to claim 1, wherein the plurality of recovery processes include expansion of a search range for an image of the mark in the image, a change of an imaging condition in the imaging unit, and a change of a mark, of a plurality of marks provided on the substrate, which is used.

9. The apparatus according to claim 1, wherein the information includes an offset setting, a type of the mark, and context information in addition to the image.

10. An article manufacturing method comprising:
    forming a pattern on a substrate by using a substrate processing apparatus defined in claim 1; and
    processing the substrate on which the pattern is formed, wherein an article is manufactured from the processed substrate.

11. A substrate processing method comprising:
    imaging a mark provided on a substrate by using an imaging unit;
    aligning the substrate based on a position of the mark which is obtained by processing an image of the mark which is obtained in the imaging;
    identifying, if the alignment has failed, a factor of the failure based on information including the image;
    determining at least one of a plurality of recovery processes, which correspond to the identified factor of the failure;
    outputting a condition for the determined at least one of the recovery processes in accordance with an inference model;
    executing the determined at least one of the recovery processes under the output condition; and
    learning the inference model based on an execution result obtained by the at least one of the recovery processes under the output condition.

12. A substrate processing system comprising a substrate processing apparatus configured to process a substrate and a management apparatus configured to manage the substrate processing apparatus,
    the substrate processing apparatus comprising:
    an imaging unit configured to image a mark provided on the substrate; and
    a transmission unit configured to transmit an image captured by the imaging unit to the management apparatus,
    the management apparatus comprising:
    a reception unit configured to receive the image transmitted from the transmission unit of the substrate processing apparatus; and
    a processor configured to instruct the substrate processing apparatus to align the substrate based on a position of the mark obtained by processing the received image,
    wherein the processor instructs, if the alignment has failed, the substrate processing apparatus to identify a factor of the failure based on information including the image and execute at least one of a plurality of recovery processes based on the identified factor of the failure, and
    the processor includes:
    an output unit configured to output a condition for the at least one of the recovery processes corresponding to the identified factor of the failure, in accordance with an inference model, and
a learning unit configured to learn the inference model based on an execution result obtained from the at least one of the recovery processes under the condition output from the output unit.

13. A management apparatus that manages a substrate processing apparatus configured to process a substrate, the management apparatus comprising:
a reception unit configured to receive an image of a mark provided on the substrate which is imaged by an imaging unit of the substrate processing apparatus; and
a processor configured to instruct the substrate processing apparatus to align the substrate based on a position of the mark which is obtained by processing the received image,
wherein the processor instructs, if the alignment has failed, the substrate processing apparatus to identify a factor of the failure based on information including the image and execute at least one of a plurality of recovery processes based on the identified factor of the failure, and
the processor includes:
an output unit configured to output a condition for the at least one of recovery processes corresponding to the identified factor of the failure, in accordance with an inference model, and
a learning unit configured to learn the inference model based on an execution result obtained from the at least one of the recovery processes under the condition output from the output unit.

14. A non-transitory computer-readable storage medium storing a program for causing a computer to function as each unit of a management apparatus defined in claim 13.

* * * * *